United States Patent [19]

Stoker

[11] Patent Number: 4,544,895

[45] Date of Patent: Oct. 1, 1985

[54] AUDIO-AMPLIFIER ARRANGEMENT

[75] Inventor: Albert Stoker, Eindhoven, Netherlands

[73] Assignee: U.S. Philips Corporation, New York, N.Y.

[21] Appl. No.: 525,191

[22] Filed: Aug. 22, 1983

[30] Foreign Application Priority Data

Aug. 25, 1982 [NL] Netherlands .......................... 8203325

[51] Int. Cl.$^4$ ............................ H03F 3/26; H03F 3/68
[52] U.S. Cl. ..................................... 330/273; 330/267; 330/295
[58] Field of Search ................ 330/146, 262, 267, 270, 330/273, 295

[56] References Cited

U.S. PATENT DOCUMENTS 3,867,709 2/1975 Seki et al. ............................. 330/267

Primary Examiner—James B. Mullins
Assistant Examiner—G. Wan
Attorney, Agent, or Firm—Thomas A. Briody; William J. Streeter; Edward W. Goodman

[57] ABSTRACT

An asymmetrically driven audio amplifier arrangement comprises two amplifiers (1, 10) whose outputs (3, 12) are each connected to a common capacitor (18) via an associated loudspeaker (7, 16). The amplifier circuits (1, 10) are driven in phase opposition, so that the signal current through said common blocking capacitor becomes substantially zero. In addition, it is possible to replace the two loudspeakers by one loudspeaker of a higher power between the outputs (3, 12) of the two amplifiers (1, 10).

1 Claim, 3 Drawing Figures

AUDIO-AMPLIFIER ARRANGEMENT

BACKGROUND OF THE INVENTION

The invention relates to an asymmetrically driven audio-amplifier comprising a first amplifier circuit having an input and an output, a second amplifier circuit having an input and an output, first output terminals for connecting a first loudspeaker to the output of the first amplifier, second output terminals for connecting a second loudspeaker to the output of the second amplifier, a capacitor arranged between a first point and ground, the first output terminals being arranged between the output of the first amplifier circuit and the first point, the second output terminals being arranged between the output of the second amplifier circuit and the first point, and the first and the second amplifier circuits being adapted to carry signals of substantially opposite phase at their outputs.

Audio amplifier arrangements for use in conjunction with asymmetrical power supplies are inter alia employed in audio equipment intended for use in cars, such as car radios. In such amplifier arrangements a direct voltage of the order of half the supply voltage appears on the output of the amplifier arrangement. Since it is undesirable for a direct current to flow through a loudspeaker, a blocking capacitor is arranged between such a loudspeaker and the output of the amplifier arrangement in order to obtain d.c. isolation between the amplifier and the loudspeaker.

Audio-amplifier arrangements frequently comprise two amplifier circuits each having an input, an output and an associated set of output terminals for the connection to an associated loudspeaker. This is, for example, the case in stereo amplifiers, which comprise one amplifier and one loudspeaker connection per channel. It is also the case if, for each stereo channel, two loudspeakers are employed, for example one in the front of the car and one in the back of the car, the volume of the sound produced by said loudspeakers being variable relative to each other, for which purpose an amplifier circuit is provided for each loudspeaker. For d.c. isolation, a capacitor is then arranged between each set of output terminals and the corresponding amplifier output, which capacitors are electrolytic capacitors which are comparatively bulky.

U.S. patent application No. 4,186,273 describes such an audio-amplifier arrangement requiring only one blocking capacitor, which is arranged between a first point and ground, the first output terminals being arranged between the output of the first amplifier circuit and the first point and the second output terminals being arranged between the output of the second amplifier circuit and the first point.

In this way the output of the first amplifier circuit is connected to the output of the second amplifier circuit via the first loudspeaker, which is coupled to the first output terminals, and the second loudspeaker, which is coupled to the second output terminals, and the point between the two loudspeakers is at the same d.c. potential as the two outputs of the amplifier circuits, which d.c. potential also appears on the capacitor. In this way the two loudspeakers are d.c. isolated by means of one capacitor. The signal current which flows through the capacitor is small because the signal currents flowing through the two loudspeakers are substantially in phase opposition. Since the signal current through the capacitor is substantially smaller than in the case where one capacitor is used for each channel, it is possible to employ a capacitor of smaller dimensions than each of the separate blocking capacitors because the minimal dimensions of a capacitor depend on the ripple current flowing through this capacitor.

SUMMARY OF THE INVENTION

It is the object of the invention to improve the above amplifier arrangement. The invention provides an audio amplifier of the type described in the opening paragraph which is characterized in that third output terminals are provided between the output of the first amplifier circuit and the output of the second amplifier circuit for the connection of a third loudspeaker therebetween, a direct voltage detector is provided for detecting the magnitude of the direct voltage across the capacitor, while a switchable input circuit is provided having a first plate, in which an input signal capable of being balanced is applied to the first and the second amplifier circuits, and a second state, in which input signals of substantially equal magnitude are applied to the two amplifier circuits, the second state existing when the direct voltage across the capacitor is lower than a predetermined value and the first state existing when the direct voltage across the capacitor exceeds said predetermined value.

This step enables an optional third loudspeaker to be arranged between the two outputs, which third loudspeaker may then receive a higher power. The blocking capacitor is then floating in the absence of other loudspeakers. The third loudspeaker is then driven in phase opposition from both sides and consequently carries no direct current but only alternating current.

Moreover, the balancing device is automatically rendered inoperative when the third loudspeaker is switched between the two amplifiers because the capacitor is then no longer connected to the outputs of the two amplifiers and carries a voltage of 0 volts, which is detected by the voltage detector. When used in a car radio, the audio-amplifier arrangement automatically adapts itself to the choice of the user for either the first and the second loudspeaker or the third loudspeaker.

DESCRIPTION OF THE DRAWING

The invention will now be described in more detail, by way of example, with reference to the accompanying drawing, in which.

DESCRIPTION OF THE PREFERRED EMBODIMENTS

Figure 1:
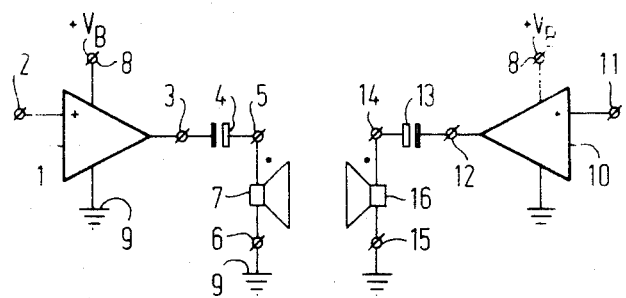
FIG. 1 shows two individual amplifier circuits each having a blocking capacitor and each having a loudspeaker connection.

FIG. 1 shows a first amplifier arrangement 1 comprising an input 2 and an output 3. The output 3 is connected to a connection terminal 5 for a loudspeaker 7 via a blocking capcitor 4, which loudspeaker 7 may also be connected to a connection terminal 6 which is connected to ground 9. The audio-amplifier arrangement further comprises a second amplifier circuit 10 having an input 11 and an output 12. Via a blocking capacitor 13, the output 12 is connected to a connection terminal 14 for a loudspeaker 16, which is also connected to a connection terminal 15, which in turn is connected to ground. Both amplifier inputs 2 and 11 are connected to non-inverting inputs of the amplifiers 1 and 10, respectively. For their power supply, the amplifiers 1 and 10 are arranged between ground 9 and a connection terminal 8 for the positive supply voltage VB.

Such an audio-amplifier arrangement requires two capacitors 13 and 4, through each of which capacitors the same signal current flows as through the associated loudspeaker. This means that the relevant capacitor must be comparatively bulky, because the minimum dimensions of the capacitor are determined by the alternating current flowing through this capacitor, and that, in particular at lower frequencies, the relevant capacitor dissipates a part of the output voltage of the associated amplifier.

An audio-amplifier arrangement as shown in FIG. 1 is frequently employed as a stereo amplifier, each of the two amplifier circuits amplifying one of the two stereo channels, and also in cases where an additional loudspeaker is required whose volume must be varied separately.

Figure 2:
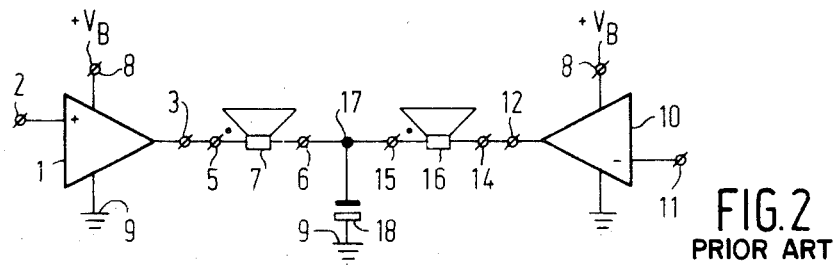
FIG. 2 shows the principle of an audio amplifier arrangement in accordance with said U.S. patent specification.

FIG. 2 shows the principle of an audio-amplifier arrangement. Components which correspond to those in the audio-amplifier arrangement shown in FIG. 1 bear corresponding reference numerals. Unlike those in the audio-amplifier arrangement shown in FIG. 1, the first loudspeaker terminals 5 and 6 are arranged between the output 3 of the amplifier circuit 1 and a first point 17 and the loudspeaker terminals 14 and 15 are arranged between the output 12 of the amplifier circuit 10 and said first point 17. Instead of two blocking capacitors 4 and 13, the arrangement shown in FIG. 2 comprises one blocking capacitor 18 arranged between the first point 17 and ground 9. Thus, only one blocking capacitor is needed for two amplifier circuits. Furthermore, compared with the audio-amplifier arrangement shown in FIG. 1, the inverting input of one of the two amplifier circuits, in the present case the amplifier circuit 10 in the audio amplifier arrangement shown in FIG. 2, is connected to the input 11. As a result of this, the signals on the outputs 3 and 12 are in phase opposition. If these signal voltages are substantially equal, the two signal currents compensate for each other in the capacitor 18 and the signal current through the capacitor 18 is substantially zero. This has the advantage that, because the alternating current through the capacitor 18 is substantially zero, no power dissipation occurs as a result of the impedance of the electrolytic capacitor at lower frequencies. As a result of the smaller signal current through the capacitor 18, a capacitor of smaller dimensions may be used for this capacitor 18, which in practice is an electrolytic capacitor. A further advantage of this drive in phase opposition, is that in the output stages of the amplifiers 1 and 10, the power supply currents in the common power supply VB, which are in phase with the output signal currents, are in phase opposition with each other, so that if the arrangement is used in a car radio the coil in the power supply line for interference suppression is loaded to a smaller extent.

The arrangement shown in FIG. 2 operates in an optimum manner when the same signals are applied to the inputs 2 and 11. However, the arrangement may also be used when stereo signals are applied to the amplifiers 1 and 10. If the same signals but of balanced strength are applied to the inputs 2 and 11, the output signals of the amplifiers 10 and 1 are substantially in phase opposition and cancel each other in the capacitor 18, though to a smaller extent.

Figure 3:
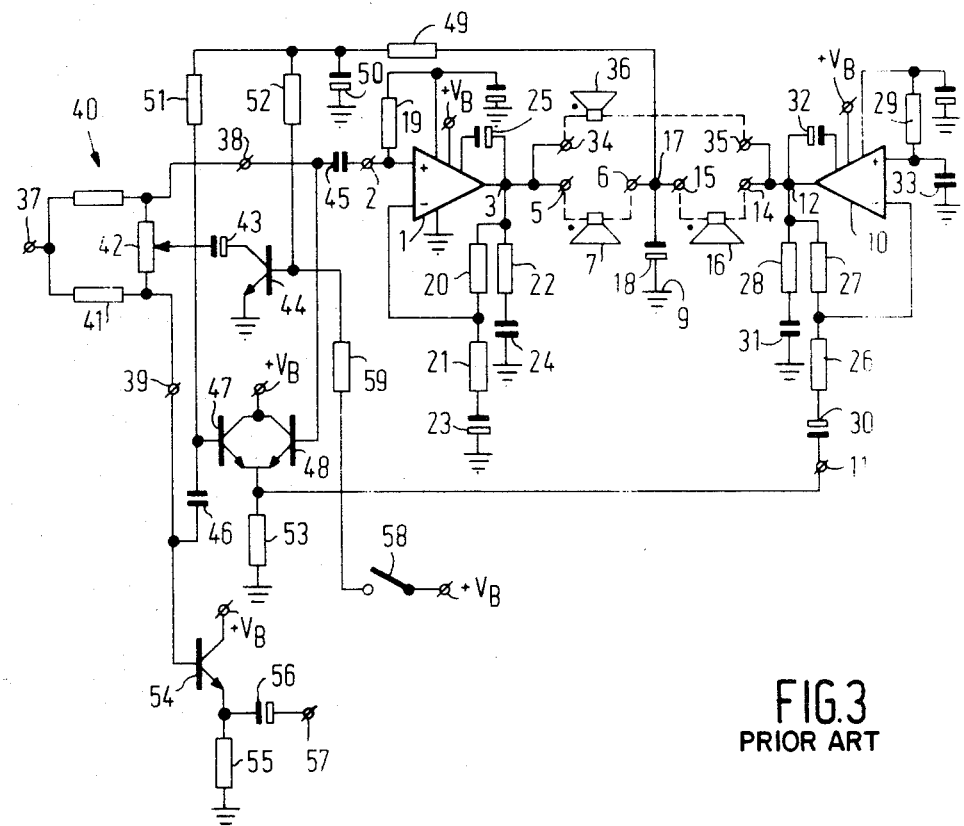
FIG. 3 shows an embodiment of an amplifier arrangement in accordance with the invention.

FIG. 3 shows a preferred embodiment of an audio-amplifier arrangement in accordance with the invention. It comprises a first amplifier circuit 1 having an input 2 and an output 3. The gain and frequency response of the amplifier circuit 1 are adjusted in the customary manner by means of resistors 20, 21, 22 and capacitors 23, 24, 25. The audio-amplifier arrangement further comprises a second amplifier circuit 10 having an inverting input 11. The gain and frequency response of this amplifier circuit 10 are also adjusted in the usual manner by means of resistors 26, 27, 28 and capacitors 30, 31, 32, 33, the gain being adjusted so that it is equal to the gain of the amplifier circuit 1. In the same way as in the arrangement shown in FIG. 2, the output of the amplifier circuit 1 is connected to the loudspeaker terminal 5, to which a loudspeaker 7 may be coupled whose other side may be coupled to a terminal 6. The output 12 of the amplifier circuit 10 is connected to the loudspeaker terminal 14, to which a loudspeaker 16 may be coupled, which is also connected to a loudspeaker terminal 15, which terminal 15 is connected to the first point 17. This first point 17 is connected to ground 9 via the capacitor 18. The outputs 3 and 12 are also connected to further loudspeaker terminals 34 and 35 between which a loudspeaker 36 may be arranged.

The arrangement shown in FIG. 3 further comprises a balancing device having an input 37 and outputs 38 and 39. A resistor 40 is arranged between the input 37 and the output 38 and a resistor 41, between the input 37 and the output 39. A potentiometer 42, arranged between the outputs 38 and 39, has its wiper connected to ground via a capacitor 43 and the collector-emitter junction of a transistor 44. When the transistor 44 conducts, the capacitor 43 in series with the transistor 44 functions as a grounding connection for the wiper of potentiometer 42. If the wiper of potentiometer 42 is at the side of the output 38, the signal on the output 38 is zero and the signal on the output 39 is maximum. If the wiper of the potentiometer 42 is at the side of the output 39, the signal on the output 39 is zero and the signal on the output 38 is maximum. In this way the outputs 38 and 39 can be balanced by means of the potentiometer 42. Via a blocking capacitor 45, the output 38 is connected to the input 2 of the amplifier circuit 1 and via a blocking capacitor 46, the output 39 of the balancing device 40 is connected to the base of a transistor 47 which, together with a transistor 48, constitutes a signal switch. If the transistor 47 conducts, the output 39 is connected to the input 11 of the amplifier circuit 10 via the capacitor 46 and the base-emitter junction of the transistor 47. The base of the transistor 48 is connected to the output 38 of the balancing device, so that when, instead of the transistor 47, the transistor 48 conducts, the output 38 is also connected to the input 11 of the amplifier circuit 10.

The first point 17, to which the blocking capacitor 18 is connected, is connected via a resistor 49 to a capacitor 50, to the base of the transistor 47 and to the base of the transistor 44 via the resistors 51 and 52, respectively.

When, instead of the loudspeaker 36, the loudspeakers 16 and 7 are connected, the voltage across the capacitor 18 is equal to the direct voltage on the outputs of the amplifiers 10 and 1, which direct voltage is equal to half the supply voltage. As a result of this, the capacitor 50 is charged to half the supply voltage via the resistor 49. Via the resistors 51 and 52 the transistors 44 and 47 are then turned on, so that the wiper of the potentiometer 42 is grounded. Since the base of transistor 47 is at a high potential and, via the balancing device, the base of transistor 48 is at a comparatively low potential from input 37, which is assumed to be at a low direct voltage, the transistor 47 is conductive and the transistor 48 is cut off. The wiper of the potentiometer 42 is then grounded via the transistor 44 and the balancing device 40 is operative. The balancing device balances the signals on the outputs 38 and 39 relative to each other, the signal on the output 39 being applied to the input 11 of the amplifier circuit 10 via the transistor 47 and a signal on the output 38 of the balancing device being applied to input 2 of the amplifier circuit, so that by means of the potentiometer 42 the signals on the inputs 2 and 11 of the amplifier circuits 1 and 10 can be balanced relative to each other.

If the loudspeaker 36 is arranged between the terminals 34 and 35, instead of the loudspeakers 7 and 16 between the terminals 5 and 6 and the terminals 14 and 16, respectively, the capacitors 50 and 18 will discharge to substantially zero volts and the base of the transistor 44 as well as the base of the transistor 47 will be at a potential of zero volts. As a result of this, the transistor 44 is cut off and the balancing device is switched off, the outputs 38 and 39 carrying the same signal. If the direct voltage level on input 37 is now sufficiently high relative to zero voltage, the base of the transistor 48 will be sufficiently high relative to zero volts, so that the transistor 48 conducts and the transistor 47 is cut off. As a result of this the input 11 of the amplifier circuit 10 receives the signal from the output 38 and the two amplifiers 1 and 10 receive the same signal, so that the loudspeaker 36 will receive the same signal from the two sides in phase opposition.

In for example car radios, the possible arrangement of a loudspeaker 36 between the two amplifiers is utilized in order to obtain a higher sound level. The loudspeaker 36 may be for example a twenty-watt loudspeaker, whilst the loudspeakers 16 and 17 may be six watts each. To enable the use of a second loudspeaker via an additional amplifier in the case that loudspeaker 36 is not selected, while maintaining the possibility of balance control with the potentiometer 42, the output 39 of the balancing device is connected to the base of a transistor 54 whose collector is connected to the power supply voltage and whose emitter is connected to ground via a resistor 55 and to an additional output 57 via a blocking capacitor 56. Now it is possible to connect a further amplifier to the output 57, which amplifier drives a further loudspeaker. The output 57 is such that when an amplifier is coupled to this output, for example, a pushbutton switch 58 is closed. Alternatively, a bridge in the relevant connector may be employed. Via a resistor 59 the switch 58 connects the base of the transistor 44 to the positive supply voltage, so that upon connection of an additional amplifier to the output 57, the transistor 44 is turned on. This activates the balancing device 40, so that the signals on the outputs 38 and 39 can be balanced relative to each other. However, via the transistor 48 the input 11 receives the same signal as the input 2 but via transistor 54 the output 57 receives the signal from the output 39. The balancing device 40 then balances the volume of sound of the signals reproduced by the loudspeaker 36 and the other additional loudspeaker.

The circuit arrangement shown in FIG. 3 thus enables the user to couple the two amplifier circuits to two loudspeakers or to one loudspeaker, automatically rendering the balancing device 40 operative or inoperative.

What is claimed is:

1. An asymmetrically driven audio-amplifier arrangement which comprises a first amplifier circuit having an input and an output, a second amplifier circuit having an input and an output, first output terminals for connecting a first loudspeaker to the output of the first amplifier, second output terminals for connecting a second loudspeaker to the output of the second amplifier, a capacitor arranged between a first point and ground, the first output terminals being arranged between the output of the first amplifier circuit and the first point, the second output terminals being arranged between the output of the second amplifier circuit and the first point, and the first and the second amplifier circuits being adapted to carry signals of substantially opposite phase at their outputs, characterized in that third output terminals are provided between the output of the first amplifier circuit and the output of the second amplifier circuit for the connection of a third loudspeaker therebetween, a direct voltage detector is provided for detecting the magnitude of the direct voltage across the capacitor while a switchable input circuit is provided having a first state, in which an input signal capable of being balanced is applied to the first and the second amplifier circuits, and a second state, in which input signals of substantially equal magnitude are applied to the two amplifier circuits, the second state existing when the direct voltage across the capacitor is lower than a predetermined value and the first state existing when the direct voltage across the capacitor exceeds said predetermined value.

* * * * *